United States Patent [19]
Cuomo et al.

[11] Patent Number: 5,468,326
[45] Date of Patent: Nov. 21, 1995

[54] APPARATUS FOR POLISHING A DIAMOND OR CARBON NITRIDE FILM BY REACTION WITH OXYGEN TRANSPORTED TO THE FILM THROUGH A SUPERIONIC CONDUCTOR IN CONTACT WITH THE FILM

[75] Inventors: Jerome J. Cuomo, Lincolndale, N.Y.; Joseph E. Yehoda, Fogelsville, Pa.

[73] Assignee: International Business Machines Corporation, Armonk, N.Y.

[21] Appl. No.: 402,824

[22] Filed: Mar. 13, 1995

Related U.S. Application Data

[62] Division of Ser. No. 6,343, Jan. 19, 1993, Pat. No. 5,403,619.

[51] Int. Cl.$^6$ ............................. B01J 15/00; B01J 19/08
[52] U.S. Cl. ......................... 156/345; 216/63; 216/67; 216/81; 427/343; 427/533; 427/539
[58] Field of Search .................... 156/345; 216/63, 216/67, 81; 427/343, 533, 539

[56] References Cited

U.S. PATENT DOCUMENTS 4,339,304 7/1982 Grigoriev et al. ................. 216/81
4,756,794 7/1988 Yoder ............................... 156/345

*Primary Examiner*—Terry J. Owens
*Attorney, Agent, or Firm*—Daniel P. Morris; Sterne, Kessler, Goldstein & Fox

[57] ABSTRACT

Apparatus and process for polishing a diamond or carbon nitride film by reaction of the film with oxygen anions at the interface between the film and a superionic conductor (e.g., yttria stabilized zirconia) placed in contact with the film. Oxygen anions produced by the formation of vacancies in the superionic conductor are transported to the interface under the influence of a chemical gradient and react with the diamond or carbon nitride. Application of an electric field and/or heat can be used to increase the oxygen partial pressure on the side of the interface opposite the film. An oxygen plasma can be supplied to the superionic conductor such that oxygen ions from the plasma transpire through the superionic conductor to the interface and react with the diamond or carbon nitride.

9 Claims, 5 Drawing Sheets

APPARATUS FOR POLISHING A DIAMOND OR CARBON NITRIDE FILM BY REACTION WITH OXYGEN TRANSPORTED TO THE FILM THROUGH A SUPERIONIC CONDUCTOR IN CONTACT WITH THE FILM

This application is a division of application Ser. No. 08/006,343, filed Jan. 19, 1993, now U.S. Pat. No. 5,403,619.

DESCRIPTION

1. Technical Field

This invention relates generally to polycrystalline diamond films, and specifically to an apparatus and method for solid-state ionic polishing of diamond.

2. Background Art

The deposition of polycrystalline diamond films is a well established technology, but there still remain several areas which need to be addressed: growth rate, heteroepitaxy, minimizing graphitic component, and control of the surface roughness, to name a few. The surface roughness associated with the growth for polycrystalline diamond remains a problem for several areas, e.g., heat management, optical and tribiological applications. Different methods have been employed to help solve this problem with varying degrees of complexity. One of the simplest methods has taken advantage of the inability of diamond to withstand machining of ferrous materials such as Fe or Ni. Under certain conditions of heat and pressure carbon tends to diffuse into the metal which is in contact with the diamond, forming a carbide layer which is polished away. (See Want et al., *SPIE Diamond Optics III* 1325:160 (1990); and Yoshikawa, M., *SPIE Diamond Optics III* 1325:210 (1990)). However, the time needed can be on the order of hours to several weeks depending on the conditions of temperature, ambient atmosphere, and prior surface treatment. The most efficient polishing is done at high temperatures (in the 750° to 950° C. range), thereby precluding polishing in anything but a vacuum or non-oxygen environment.

Other methods that have been investigated are planarizing with a laser (see Yoshikawa, M., *SPIE Diamond Optics III* 1325:210 (1990)), etching with oxygen and argon ion beams using a planarizing layer spun onto the diamond (see Tianji et al., *SPIE Diamond Optics III* 1325:210 (1990)), and more recently the diffusion of carbon from the diamond into Fe or Mn during a high temperature (about 900° C.) anneal followed by an acid etch to remove the carbonaceous layer (see Jin et al., *Appl. Phys. Lett* 60:1948 (1992)). In the latter case a mechanical polish was also necessary to completely remove the residue left after the anneal.

To minimize complexity, a polishing method using a moderately low temperature that can be carried out at atmospheric pressure, without the necessity of special gases and mechanical motion, is desirable.

DISCLOSURE OF THE INVENTION

The present invention is directed to an apparatus and a method for polishing diamond or a carbon nitride films which circumvents the need for high temperatures or special ambient atmospheres and, in addition, eliminates the need to mechanically move the diamond with respect to the polishing lap.

The method according to the present invention is a static process which eliminates the necessity to mechanically move the diamond and polishing lap with respect to each other. No pre- or post-processing is required. In addition, there is no residue of the polishing process which needs to be removed and the polishing can be accomplished at much lower temperatures and in air.

According to the present invention, diamond or a carbon nitride films can be polished by using an oxygen superionic conductor. The superionic conductor may transport oxygen ions to the surface via one or more mechanisms, including a chemical gradient which may be aided by an applied potential (on the order of 100 V) and/or an elevated temperature (about 250° C. to about 350° C.). Although Applicants are not bound by any particular theory, it is believed that elevated temperatures assist in the reaction of the oxygen with the diamond or a carbon nitride surface. The diamond or a carbon nitride surface features in contact with the superionic conductor are volatilized into CO and/or $CO_2$, resulting in their removal. As a result, the diamond or a carbon nitride surface takes on the same surface finish as that of the superionic conductor. Embossing and selective etching of diamond or a carbon nitride can also be achieved according to the present invention.

The foregoing and other features and advantages of the invention will be apparent from the following more particular description of preferred embodiments of the invention, as illustrated in the accompanying drawings.

BEST MODE FOR CARRYING OUT THE INVENTION

Yttria-stabilized zirconia (YSZ), $Y_2O_3 \cdot ZrO_2$, is one of a class of materials known as defect stabilized ceramic oxide superionic conductors. Other superionic conductors which may be used in the present invention include $M_2O_3 \cdot ZrO_2$. where M=La, Sm, Y, Yb, or Sc; and $CaO \cdot MO_2$. where M=Zr, Hf, Th, or Ce. (See B. C. H. Steele, Oxygen ion conductors and their technological applications, Materials Science and Engineering, B13 (1992) pp.79–87.)

These unique materials are electrical insulators, but at elevated temperatures, $O^{2-}$ can be conducted through these materials with conductivities approaching $10^{-1}$ $(\Omega\text{-cm})^{-1}$. The motion of anions in these materials is associated with the formation of oxygen vacancies due to the substitution of lower valence cations into the host cation positions. The level of conduction is generally a function of the temperature and the amount and speed that $O^{2-}$ will transpire through a particular material.

It is known that substitution of aliovalent cations of lower valence into a higher valence site can result in either cation interstitials or anion vacancies to maintain charge neutrality. (Aliovalent ion substitutions are ionic substitutions into the host lattice with a charge that is different that the host and produces defects such as vacancies resulting in charge neutralization.) For the case of Ca replacing Zr in $CaO.ZrO_2$, one anion vacancy is created for every Ca substitution: $Zr_{1-x}Ca_xO_{2-x}\square_x$, where $\square$ represents a anion vacancy. In the case of YSZ, substitution of Y into the Zr sites create one oxygen anion vacancy for every two Y cations. The activation energies for the defect motions are about 18 to 25 kcal/mol in YSZ (see Choudhary et al., in *Solid Electrolytes and their Applications*, p. 42, Subbarao, Plenum Press, New York (1980)).

Figure 1:
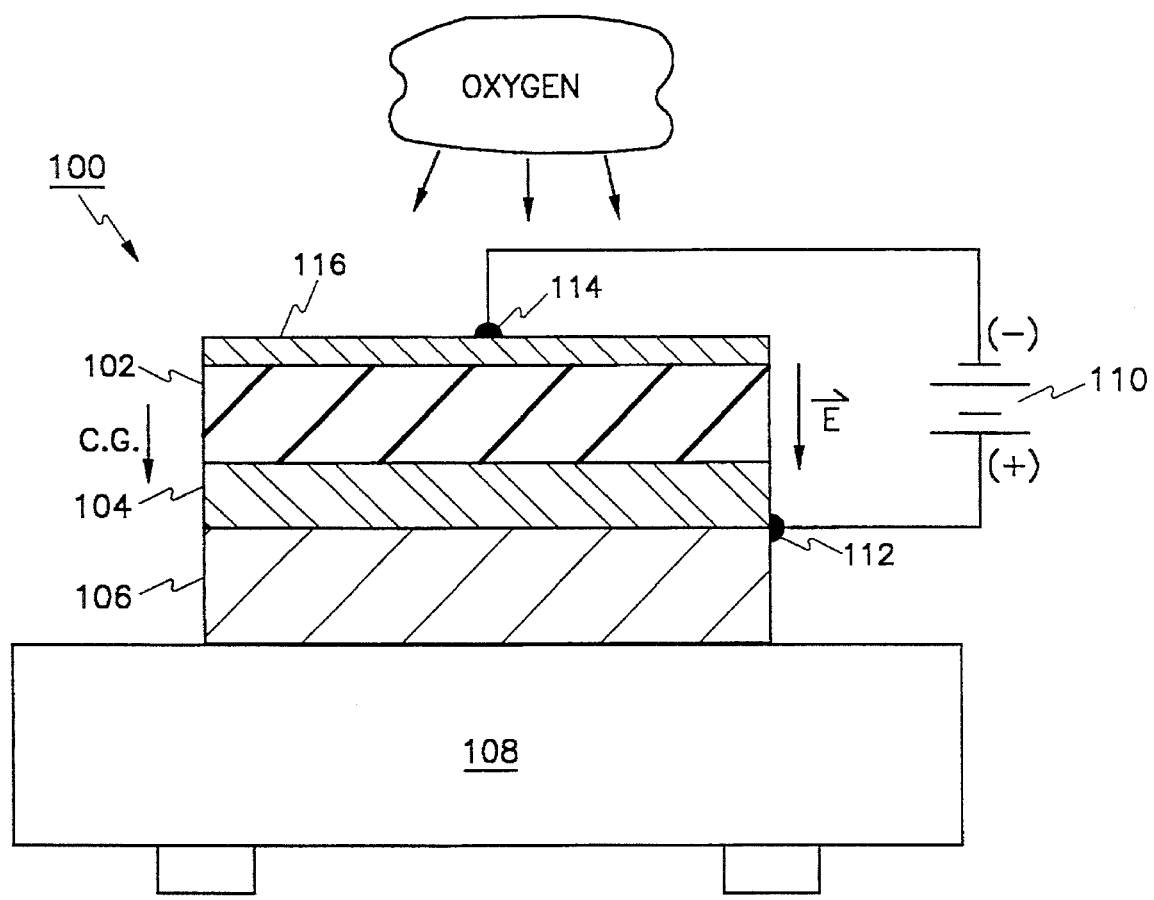
FIG. 1 is a representative schematic diagram of a polishing apparatus of the present invention.

Turning now to the present invention, an apparatus 100 for performing solid-state polishing of diamond is shown in FIG. 1. The apparatus 100 comprises a polished single crystal piece of 200–1000 μm thick YSZ wafer 102 (preferably about 500 μm thick; having Miller indices of (200)), on top of a polycrystalline diamond film (layer) 104 grown by conventional microwave chemical vapor deposition (CVD) on a crystalline Si substrate 106 (between about 300–800 μm thick). The YSZ wafer 102 will hereafter be called "polishing layer" 102. In a preferred embodiment, the YSZ polishing layer 102 composition is about 9.5 mol % $Y_2O_3$ in $ZrO_2$, which corresponds to a high $O^{2-}$ conductivity composition (see Choudhary et al., in *Solid Electrolytes and their Applications*, p. 41 Subbarao, Plenum Press, New York (1980)). This specific composition is not critical to the present invention.

Layering (e.g., contacting) of the YSZ polishing layer 102 on the diamond layer 104 permits elevated carbon features on the diamond to react with $O^{2-}$ from the YSZ layer 102 causing a chemical gradient to form within the layers. If the partial pressure of oxygen on the upper surface of the YSZ polishing layer 102 is increased to about 0.2–1.0 atm, additional $O^{2-}$ diffuses through the layer 102 to the interface with layer 104 for reaction with the carbon and polishing of the diamond. As the carbon surface features react with $O^{2-}$, the diamond layer 104 is in effect polished. However, the partial pressure of oxygen may be between about 0.001 to 100 atm.

The apparatus 100 may include an optional heater means used to elevate the temperature of at least layers 102 and 104 to achieve a temperature of about 25°–950° C., most preferably, about 390° C. The heater means may comprise an electrically heated block 108, e.g., a conventional hot plate, or the like. In the alternative, the heater means may be a means for providing electromagnetic radiation which can be absorbed by one of the layers 102 and 104, e.g., microwave, laser or RF energy. The elevated temperature acts as a further activation source which allows the $O^{2-}$ to overcome the energy barrier present between the anion sites in the defect structure of the YSZ polishing layer 102. Thus, when a heater means is employed, the diamond layer 104 may be polished at a faster rate.

The apparatus 100 may further include an optional means 110 for applying an electrical field gradient, or potential, across at least layers 102 and 104 which drives the $O^{2-}$ toward the diamond surface. In a preferred embodiment, the means 110 may comprise a conventional current-limited power supply having a positive terminal connected to the diamond layer 104 and/or the substrate 106 at a contact 112, and a negative terminal connected to the upper surface the YSZ polishing layer 102 (i.e., the surface opposite the surface adjacent the polishing interface). The contact 112 can be made by coating with suitable metal or conductive oxide materials, such as Pt films from about 50–1000 Å, and/or conducting oxides such as pervoskite oxides with the general formula of $ABO_3$ or mixed oxide conductors such as $ABO_3$-$ABO_{2.5}$ (as described in Steele, supra). Attached to the contacts 112 and 114 are conductors that provide current paths to the power supply 110.

Because YSZ is an electrical insulator, the contact 114 may be a point contact giving rise to a very non-uniform electric field, with the field lines being more concentrated near the point of contact. The non-uniform electric field can be eliminated if the surface of the YSZ polishing layer 102 opposing the polishing surface is coated with a conductive layer 116 comprising a paste, paint, or the like. In this case, the contact 114 is made to the conductive layer 116. A conductive paste of graphite, silver, platinum, or an equivalent electrically conductive material, capable of transpiring oxygen, may be applied to the upper surface of the YSZ polishing layer 102 and sintered as necessary to improve the even spreading of the electric field. Alternatively, doping or ion implantation can be used to increase the conductivity of the upper surface of layer 102.

Single crystal or polycrystalline ionic conductors can be used, with only a small reduction in ion conductivity expected for the latter. Again, to improve the uniformity of the electric field through the ionic conductor, a permeable electrode (e.g., about 50 Å of Ag or Pt, or other suitable metal) can be deposited onto its surface. To implement solid-state ionic polishing on the surfaces of non-conductive materials, one can use another technique to change the surface conductivity to the desired depth of polishing. This may take the form of a damage layer via implantation or laser processing.

Initial voltages of between about 100 to 200 V may be applied and held constant for several hours, with resulting currents of several to tens of milliamperes. By employing the current-limited power supply, a controlled etch can be achieved with typical operating parameters of 1 mA at 50 to 80 V. The 1 mA applied current may be chosen as the standard polishing condition. Variations in the size of the YSZ polishing layer 102 will result in changes in the actual current density therethrough.

The $O^{2-}$ is formed in the superionic conductor layer by the formation of ordered vacancies in the layer. The $O^{2-}$ is then transported by the chemical gradient to the diamond YSZ interface. The mechanisms for polishing is believed to be the formation of a volatile oxide of carbon, e.g., CO and/or $CO_2$ at the diamond-YSZ interface. Because the free energy of formation for $CO_2$ (−94.3 kcal/mol) is lower than that of CO (−32.8 kcal/mol), $CO_2$ is believed to be the dominate volatile product of polishing.

The following initial polishing rate (on rough samples about 1 μm in thickness) has been observed by the inventors: 1940 Å in 30 min (about 65 Å/min) using a fixed current of about 25 mA applied to an area of about 0.14 $cm^2$ (which is about 1.8 mA/$cm^2$). If the $O^{2-}$ ions are the sole charge carriers, the flux of $O^{2-}$ through the YSZ polishing layer 102 can be related to the current density by i=2 eJ, where i=current density; e is the electron charge; and J is $5.6 \times 10^{15}$ $O^{2-}$/$cm^2$-sec.

Assuming a diamond film density of 3.5 g/$cm^3$ (bulk), this corresponds to an etch rate of about 191 Å/min for a smooth diamond film, providing that each $O^{2-}$ reacts to form a molecule of CO. The apparent process efficiency, or carbon atoms removed per $O^{2-}$ ion, is thus 0.34. However, the etch rate of rough diamond are expected to be higher, because they have a smaller diamond/superionic conductor contact area (implying a higher local $O^{2-}$ flux at the facet contacts), and because polishing only removes material form the facets (so the same etch depth can be achieved with the removal of a smaller number of carbon atoms). The similarity of the observed and calculated diamond etch rates thus suggests that the overestimate of the process efficiency resulting from the assumption of 100% reaction of $O^{2-}$ with carbon is compensated by the higher initial etch rate on the rough sample. The influence of film topology on the etch rate is also suggested by the observation that the apparent process efficiency, again averaged over a 30 min etch time, decreases at higher current densities (e.g., an efficiency of about 0.13 for i=14.3 mA/cm$^2$).

Assuming that $CO_2$ is the reaction product, this corresponds to a removal of about $1.5 \times 10^{15}$ carbon atoms/cm$^2$-sec, or approximately 1 monolayer/sec. Given a covalent radius of about 0.77 Å for a carbon atom, this corresponds to about 1.5 Å/sec removal rate. Tests on a 0.14 cm$^2$ piece of YSZ with a 0.25 Å applied current (1.8 mA/cm$^2$) for about 20–40 mins resulted in removal of about 1940 Å of diamond. This compares with a predicted removal of 4860 Å, a factor of 2.5 less. The lower amount of diamond etched away may be attributed to the following factors: (1) not all $O^{2-}$ reacting with the carbon to form $CO_2$; (2) initially the YSZ is only in contact with the peaks of the diamond facets, so that the effective area for the reaction to take a place is initially small; (3) $O^{2-}$ conduction may not be the only mechanism; there could be cation, electron, or hole conduction occurring resulting in a lower than expected $O^{2-}$ transport. All of these factors are at present being addressed in the following ways.

To determine what the reaction product is, a correlation of current flow in the YSZ with the output from a residual gas analyzer, will give direct evidence of which oxide of carbon is being produced. Starting with smooth diamond will eliminate the concern of contact area so that a true rate can be established. To address the mechanism of $O^{2-}$ conduction, impedance spectroscopy measurements may be conducted to determine if there are any other charge carriers participating under the polishing conditions. This possibility is most unlikely if one considers that Arrhenius plots of conductivity versus 1/T for 10 mol % $Y_2O_2$ in $ZrO_2$ shows linear behavior down to 400° C. (See Catlow, C. R. A, in *Superionic Solids and Solid Electrolytes: Recent Trends*, p. 366, ed. Laskar et al., Academic Press, New York (1980).) This is indicative of $O^{2-}$ vacancy motion dominating the conductivity (see Etsell and Flengas, *Chemical Rev.* 70:339 (1970)).

Under high current and limited oxygen conditions, the YSZ polished layer darkens throughout its thickness. This has been observed by others (see Casselton, R. E. W., in *Electromotive Force Measurements in High-Temperature Systems*, p. 157, ed. Alcock, A. C, American Elsevier Publishing Co., New York (1968)), and is attributed to the formation of color centers. These color centers are formed as a result of oxygen anions being depleted from the YSZ polishing layer at a rate faster than they can be supplied by the ambient atmosphere via the reaction $\frac{1}{2}O_2 \rightarrow O^{2-}+V_o$, where $V_o$=anion vacancy. The excess vacancies formed are then filled by electrons from the negative terminal, thereby causing the darkening.

At the operating conditions of 1 mA in air, no darkening is observed. Controlled experiments with applied currents up to 3 mA (about 21.4 mA/cm$^2$) for 30 minutes in air have shown no evidence of darkening. The darkening only occurred under controlled polishing when the applied current was not regulated and typically exceeded 120 mA, which would correspond to greater than about 100 mA/cm$^2$ for 30 minutes some cases. If the ambient atmosphere in which the polishing is taking place is made oxygen rich, a higher current density can be tolerated because of the increase in the ion current transport (see Steele, supra). An upper limit of current density was not established for the present process.

Figure 2A:
FIGS. 2A, 2B, and 2C show scanning electron microscope micrographs of unpolished diamond, partly polished diamond, and polished diamond, respectively.
Figure 2B:
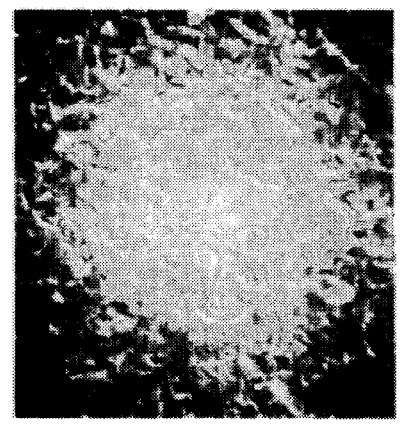
Figure 2C:
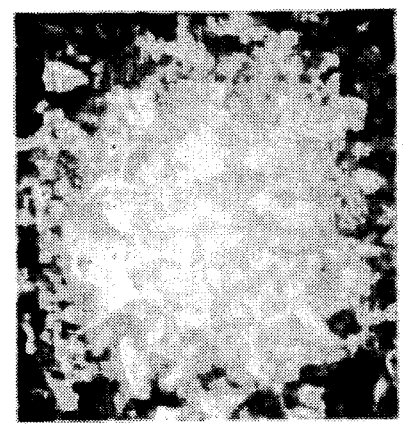

FIGS. 2A–C depict three scanning electron microscope (SEM) micrographs showing the initial diamond surface and two diamond layers polished to different stages of completion, respectively. The very faceted surface morphology is most apparent in FIG. 2A. Note that in FIG. 2C the grain structure of the polycrystalline diamond layer is still visible after polishing away the facets and the etch appears to be non-selective (i.e., non-orientation dependent).

Figure 3A:
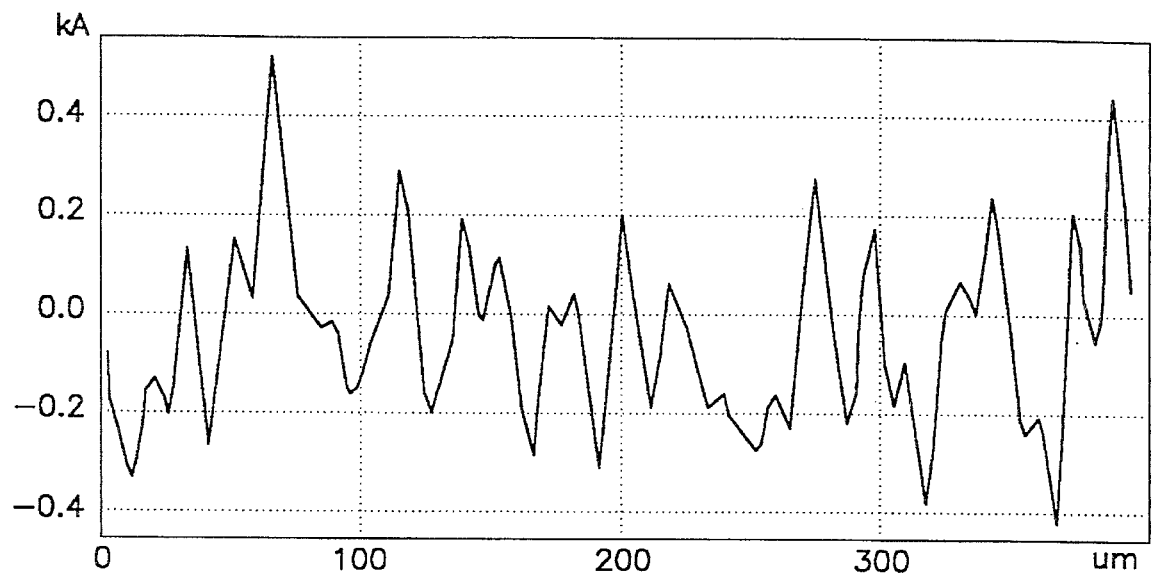
FIGS. 3A and 3B show surface profilometer traces of unpolished and polished diamond films, respectively, with a stylus radius diameter of 12.5 µm.
Figure 3B:
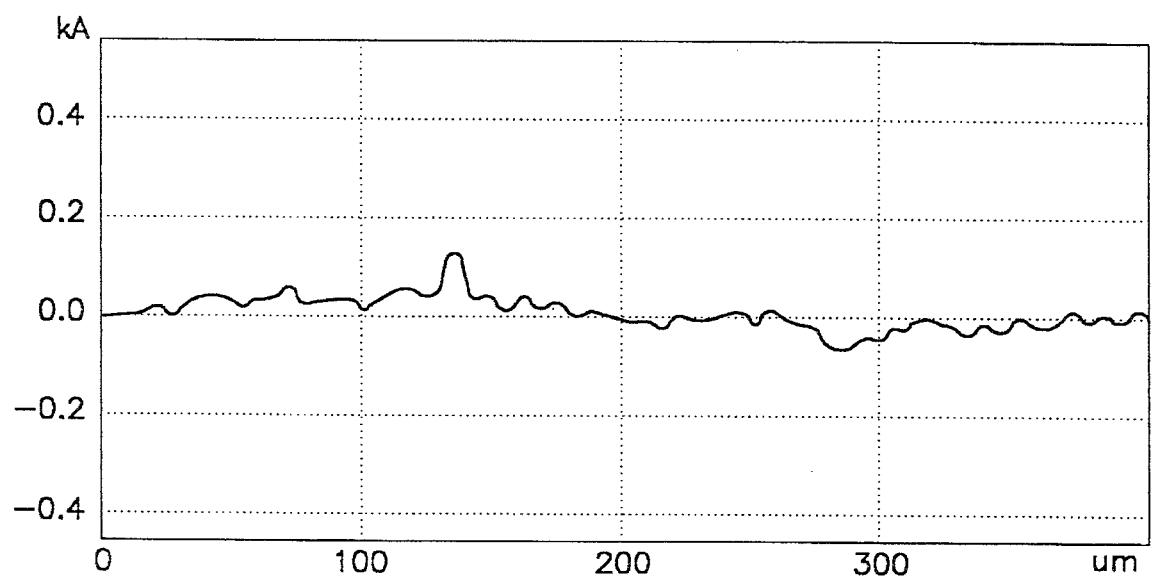

FIGS. 3A and 3B show surface profilometer traces of unpolished and polished diamond films, respectively, with a stylus radius diameter of 12.5 µm. FIG. 3A shows that the peaks of the facets have been polished flat. FIG. 3B shows another layer which has been polished further than that in FIG. 3A. Note that the typical peak-to-valley distance is about 400 Å for the unpolished diamond, whereas the peak-to-valley for the polished diamond is less than about 50 Å. A substantially smooth superionic conductor layer (e.g., typical peak-to-valley distance of less that about 20 Å), can be used to achieve substantially smooth diamond films in accordance with the present invention.

Figure 4:
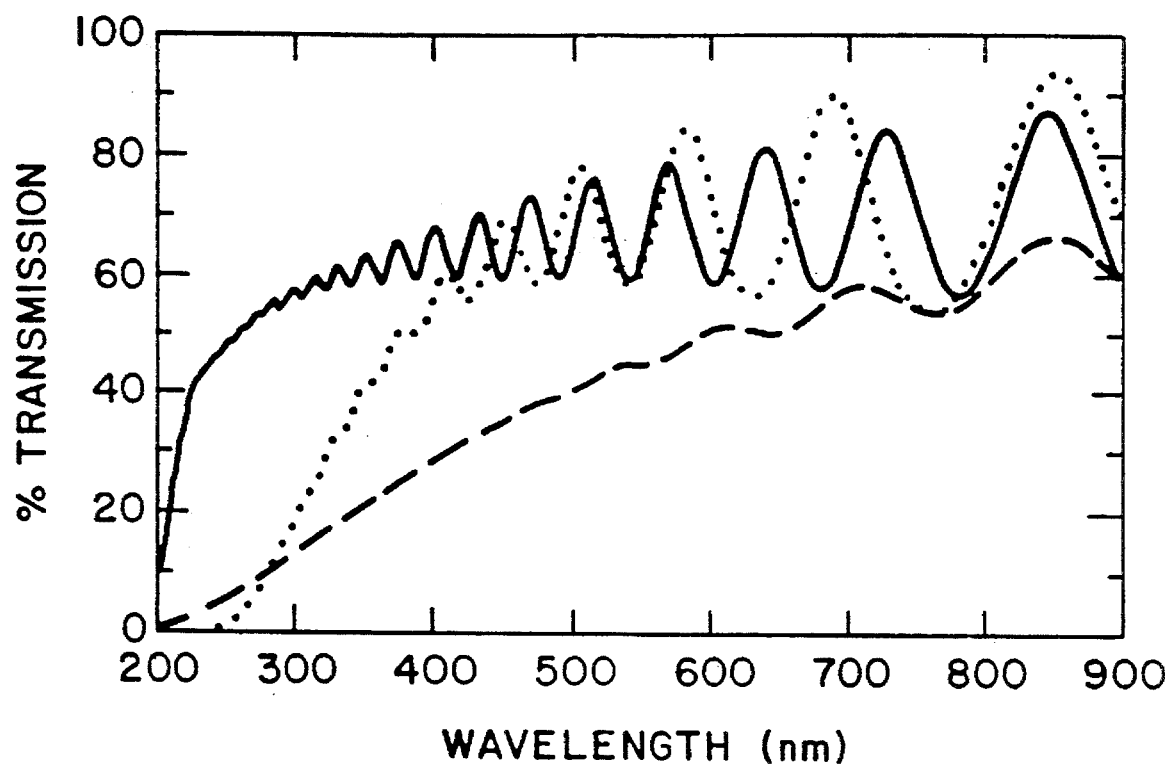
FIG. 4 shows transmission from 200 to 900 nm for unpolished diamond (- - - ), silicon carbide (SIC) ( . . . ), and polished diamond (-) membranes of 1.04, 1.0, and 1.14 µm thickness, respectively.

FIG. 4 shows the percentage transmission of electromagnetic radiation from 200 to 900 nm for unpolished diamond (- - -), high temperature chemical vapor deposition (HTCVD) silicon carbide (SIC) (...), and polished diamond (-) membranes of 1.04, 1.0, and 1.14 µm thickness, respectively. FIG. 4 shows optical transmission in polished diamond begins to fall off below about 225 nm, and still exhibits transmission of about 9% at 200 nm. This compares with the near-UV cut-off of about 226 nm for natural type IIa diamond (see Field, in *The properties of Diamond*, p. 652, ed. Field, Academic Press, New York (1979)). The fall-off is indicative of very little nitrogen impurity in the film, unlike type Ia diamond which has a strong UV absorption and cut-off at about 246 nm (see Field, in *The properties of Diamond*, p. 652, ed. Field, Academic Press, New York (1979)). This suggests that polycrystalline diamond polished according to the present invention has even less nitrogen than type IIa. Transmission measurements out to 2500 nm show little difference between the polished and unpolished diamond, and only start to deviate from each other at wavelengths below about 1000 nm. At these wavelengths the surface roughness starts to dominate and transmission is degraded.

In further embodiments of the present invention, a range of oxygen ion conductors can be used, i.e., defect stabilized ceramic oxides of the classes: $CaO.MO_2$, where M=Zr, Hf, Th, Ce and $M_2O_3.ZrO_2$, where M=La, Sm, Y, Yb, and Sc. Any other $O^{2-}$ ion conductor can also be employed, with its efficiency as a polishing agent determined by the flux of anions which can be conducted through the material per unit electric field. The present invention is also applicable for polishing carbon or any carbonaceous material that reacts with oxygen and any $O^{2-}$ ion conductor, such as hard materials, e.g., $C_xN_y$, whose oxides are volatile.

$C_xN_y$ films have been polished using the same conditions used to polish the polycrystalline diamond films described above. For example, carbon nitrides have been formed via an ion bean sputtering technique employing Kaufman-type and microwave driven ion bean sources.

Figure 5:
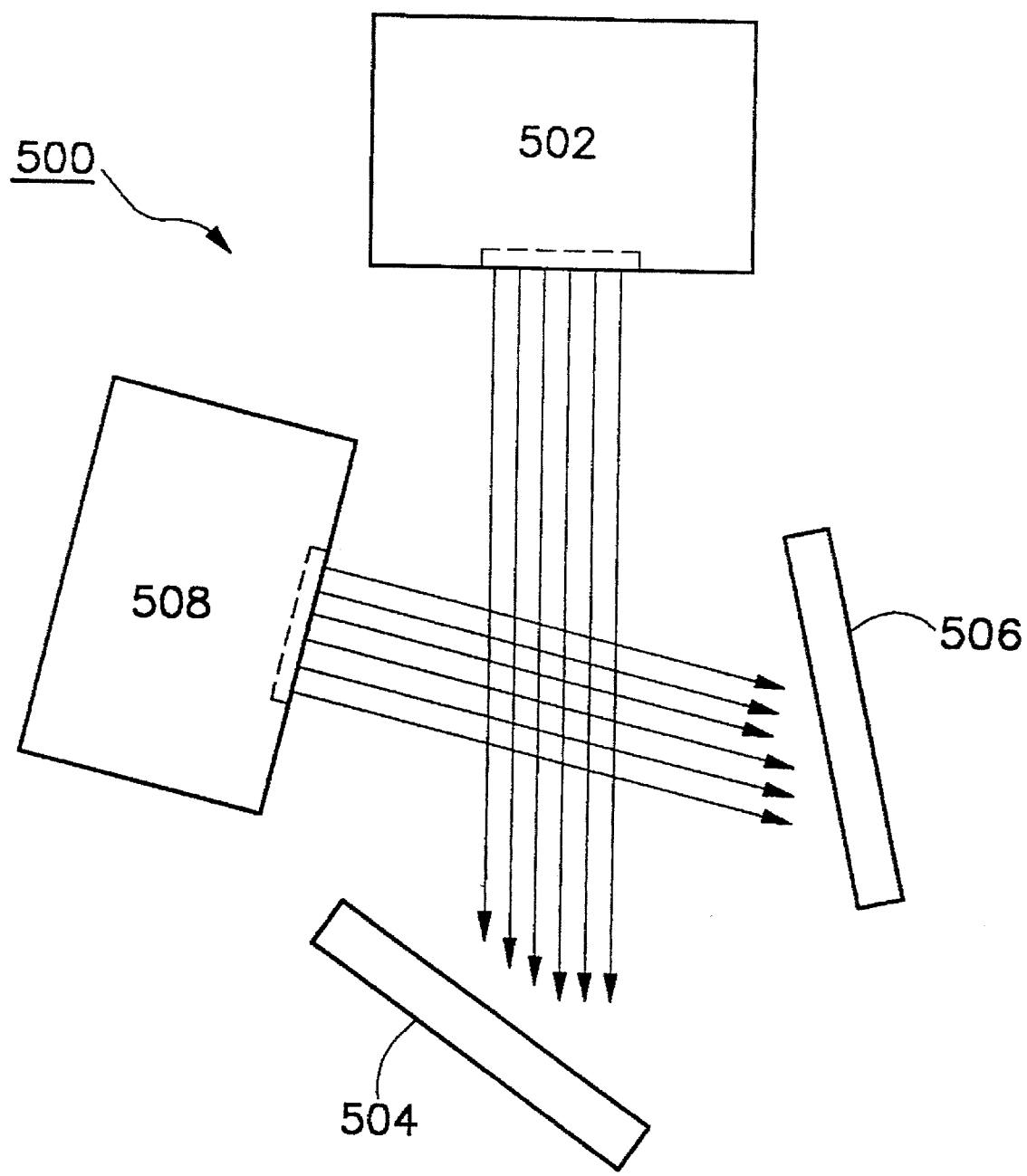
FIG. 5 shows a representative diagram of an apparatus for forming carbon nitride films that can be polished according to the present invention.

A representative apparatus 500 for forming carbon nitrides is shown in FIG. 5. A Kaufman-type broad-beam nitrogen ion source 502 is aimed at a graphite target 504 and the sputtered atoms are collected on one or more a substrates 506 mounted as generally shown in the figure. In addition, a second nitrogen ion bean source 508, which can be either a Kaufman-type or a microwave driven ion bean source, is aimed at the substrate 508 during the deposition in order to incorporate a higher fraction of nitrogen into the films being grown. The composition of the resulting films ($C_xN_y$) can be varied through control of the ion energy and ion current density from the second source 508 aimed at the substrate 506 during film growth. The minimum value that has been obtained for x according to this technique is 1.2 (i.e., $C_{1.2}N_1$).

Compositional analysis was made using Rutherford Backscattering Spectroscopy (RBS) employing aluminum precoated carbon substrates to separate the film and substrate signals for analysis. X-ray diffraction analysis of the films revealed an amorphous state in all cases. Electrical characterization was performed using a standard four-point probe. Film depositions were carried out at temperatures ranging from ambient to 700° C. with the film resistivity ranging from $3 \times 10^{-3}$ ohm-cm (at a deposition temperature of about 656° C.) to about 5 ohm-cm (at a deposition temperature of about 30° C.).

In a preferred embodiment of the present invention, apparatus 100 of FIG. 1, without means 110, is placed in a low pressure plasma CVD chamber. A process gas of oxygen at about 0.001–1.5 atm is converted into a plasma in a conventional manner, which supplies ionized oxygen $O^{2-}$ to the YSZ polishing layer 102. The oxygen plasma is at the opposite surface of the YSZ polishing layer and the YSZ polishing layer is in between the plasma and the diamond. A potential can also be sustained on the plasma, which is different than the potential at the interface surface. Thus, the plasma is not only a chemical source of $O^{2-}$, but also may form one of the "electrodes" for an electrical potential gradient. Thus an electric potential gradient may be provided in the CVD chamber to promote further transpiration of oxygen through the layer 102. Controlled heating of the chamber can also be performed in a straight forward manner. A source of confirmation is The Handbook of Plasma Processing Technology, Edited by S. M. Rossnagel, J. J. Cuomo and W. D. Westwood, Noyes Publications (1990).

The solid-state ionic polishing of the present invention may be used to pattern valleys in an etched ionic conductor with a metal which acts as an etch stop for diamond embossing. Embossing of diamond layers is applicable to archival storage, as well as patterning of diamond coated stampers for compact disks, and other applications where a patterned diamond layer is desired.

Diamond films having substantially scratchless polished surfaces, compared to conventionally polished films, can be produced in an atmosphere having oxygen by using a substantially scratchless surface of a superionic conductor layer. By using a patterned superionic conductor layer, the polishing transfers a negative imprint of the pattern to the diamond film.

The present invention produces smooth diamond surfaces for many applications, such as: reduced optical scatting, a planar surface for lithography, planar surface for tribological application, planar surface for thermal management applications and to improve the thermal conductivity of the surface. The present invention may be employed in many other applications where a smooth diamond surface is necessary.

Although no mechanical motion is necessary for solid-state ionic polishing according to the present invention, which defines one of the unique properties of the disclosed method, the solid-state ionic polishing may be enhanced in combination with mechanical motion so as to provide a chemical-mechanical polish.

While the invention has been particularly shown and described with reference to preferred embodiments thereof, it will be understood by those skilled in the art that the foregoing and other changes in form and details may be made therein without departing from the spirit and scope of the invention. All cited patent documents and publications in the above description are incorporated herein by reference.

Having thus described our invention, what we claim as new and desire to secure by Letters Patent is:

1. An apparatus for polishing a diamond or a carbon nitride film in an atmosphere having oxygen, comprising:
   (a) a superionic conductor layer having a first surface in contact with the film to form an interface with said first surface; and
   (b) means for contacting said superionic conductor layer with oxygen at a second surface thereof, wherein said superionic conductor layer is capable of conducting the oxygen from the second surface to said interface for reaction with carbon in the film and thereby polishing the film.

2. The apparatus of claim 1, wherein said means provides said oxygen at a partial pressure of about 0.001 to 100 atm.

3. The apparatus of claim 1, further comprising heater means for heating said superionic conductor layer and the film at a temperature of about 25° to 950° C.

4. The apparatus of claim 1, further comprising means for applying an electric field across at least said superionic conductor layer.

5. The apparatus of claim 1, further comprising a chamber containing said superionic conductor layer, and means for generating a plasma in said chamber such that said polishing is capable of being performed at an oxygen partial pressure of about 0.001 to 1.5 atm.

6. The apparatus of claim 1, wherein said first surface of said superionic conductor layer is patterned, and said polishing thereby transfers a negative imprint of said pattern to the film.

7. The apparatus of claim 1, wherein said superionic conductor layer is yttria-stabilized zirconia.

8. The apparatus of claim 1, wherein the film is a single crystal diamond film.

9. The apparatus of claim 1, wherein the film is a polycrystalline diamond film.

* * * * *